(12) United States Patent
Yanagisawa et al.

(10) Patent No.: US 6,953,348 B2
(45) Date of Patent: Oct. 11, 2005

(54) IC SOCKET

(75) Inventors: Wasuke Yanagisawa, Tokyo (JP); Atsushi Sato, Tokyo (JP); Mitsuhiro Suzuki, Tokyo (JP); Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 10/826,318

(22) Filed: Apr. 19, 2004

(65) Prior Publication Data

US 2004/0212383 A1 Oct. 28, 2004

(30) Foreign Application Priority Data

Apr. 25, 2003 (JP) .................................. P2003-121573

(51) Int. Cl.⁷ .............................................. H01R 12/00
(52) U.S. Cl. ........................................ 439/66; 333/260
(58) Field of Search ........................... 439/63, 66, 579, 439/700; 324/754, 761; 333/260

(56) References Cited

U.S. PATENT DOCUMENTS 5,302,923 A * 4/1994 Mason et al. ................ 333/33
6,102,709 A * 8/2000 Howard et al. ............... 439/66
6,776,623 B1 * 8/2004 Yunker et al. ................ 439/71
6,844,749 B2 * 1/2005 Sinclair ....................... 324/761

FOREIGN PATENT DOCUMENTS

JP 2001-99889 4/2004

* cited by examiner

Primary Examiner—Khiem Nguyen
(74) Attorney, Agent, or Firm—Morgan, Lewis & Bockius LLP

(57) ABSTRACT

An IC socket receives an IC provided with arrayed terminals. In the IC socket, a conductive block is formed with a first face opposing to the received IC, and a plurality of holes arrayed in association with the terminals of the received IC. Each of a plurality of contact probes is disposed in each of the holes, and is provided with a conductive pipe, and a conductive plunger, retractably provided at a first end of the pipe, the plunger being to be brought into contact with an associated one of the terminals. A retainer provided with an insulative member through which the pipe is coaxially held within an associated one of the holes while forming a gap between an outer periphery of the pipe and an interior wall of the associated one of the holes. At least one of the contact probes to be brought into contact with an RF signal terminal among the terminals of the received IC is retained by the retainer.

4 Claims, 9 Drawing Sheets

IC SOCKET

BACKGROUND OF THE INVENTION

The present invention relates to an IC socket used for establishing reliable connection between electrode terminals of an IC, and a wiring board or the like connected to inspection equipment at the time of inspection of a monolithic IC or a hybrid IC, such as an LSI (a large-scale integrated circuit), or a module component into which a plurality of discrete components, such as ICs and LCRs, are integrated to perform a required function (the ICs and the module components are hereinafter collectively referred to simply as an "IC").

More specifically, the present invention relates to an IC socket capable of connecting a high-frequency, high-speed IC (an analog high frequency is called a high frequency; a digital frequency having a very short pulse width and a very short pulse interval is called high-speed and both frequencies are hereinafter collectively referred to as radio frequency "RF") in which terminals are arranged with a very narrow pitch of about 0.4 mm, so that the IC can transmit a signal without fail.

Characteristics of a recent IC which has been highly integrated and has attained high performance must be inspected before it is actually mounted on a circuit. When such an IC is inspected, wiring terminals of a wiring board which is connected to inspection equipment and has wiring patterns formed thereon must be reliably connected to electrode terminals of an IC without use of soldering. Therefore, an IC socket employing leaf springs or contact probes provided on an insulative base is used. Particularly, in the case of a recent IC, in which the number of electrode terminals is increased and intervals become smaller, the IC can be preferably connected by way of slender leads through use of contact probes which require smaller contact areas.

FIG. 9 shows an IC socket 70 using such contact probes. In the IC socket 70, contact probes 72 are arranged in a matrix manner so as to correspond to electrode terminals 73a of an IC 73 mounted on a plastic or ceramic base 71. Each of the contact probes 72 is configured such that a pair of plungers are held in a metal pipe by way of a spring, so that the plungers are retractably projected from both ends of the metal pipe.

When the IC 73 is pressed against one side of the IC socket 70 while being positioned by a guide hole 71a, reliable contacts are established between the terminals 73a and one ends of the contact probes with the aid of the elastic retraction of the plungers. The other side of the IC socket 70 is mounted on a wiring board 75 on which wirings connected to the inspection equipment are provided, and fixed thereon through use of screws or the like. The contacts between the other ends of the contact probes and the wirings can be also reliably established with the aid of the elastic retraction of the plungers.

However, the recent IC is susceptible to a higher-frequency and higher-speed signal as well as to high integration and high performance. In the case of a narrow lead such as a contact probe, transmission of an RF signal of 1 GHz or higher is hindered by a reactance component of the lead, or influence of signal reflection cannot be ignored. For instance, even when contact probes are shortened to a size of the order of about 2 mm in order to reduce an inductance component, difficulty is encountered in reducing the reactance component of the contact probes to 1 nH or less. For instance, a probe of 1 nH yields impedance of 63 Ω at 10 GHz.

In order to solve such a problem, in a jig for inspecting a module device, there is conceived a coaxial structure, in which a metal block serves as a base and contact probes are inserted into through holes by way of dielectric tubes (see Japanese Patent Publication No. 2001-99889A).

As mentioned previously, in association with the frequency and speed of an IC having been increased, a conventional IC socket formed by setting contact probes upright on an insulative base suffers inhibition of signal transmission such as distortion of a waveform due to attenuation or reflection, to thus fails to perform accurate inspection. For this reason, realization of a probe of coaxial structure is also conceivable.

However, in order to achieve predetermined impedance through use of the coaxial structure, an outer diameter "d" of each of a plurality of contact probes serving as core conductors and an inner diameter "D" of a hole of a metal block serving as an outer conductor must satisfy the relationship expressed by Equation (1) while a relative dielectric constant of a dielectric substance interposed between the contact probes and the metal block serves as $\epsilon_r$.

$$Z_0 = \frac{60}{\sqrt{\epsilon_r}} \log_e \frac{D}{d} \qquad (1)$$

Therefore, even when an attempt is made to realize a coaxial structure of 50 Ω through use of a tube formed from polytetrafluoroethylene, which is known as a dielectric having a small relative dielectric constant on the order of 2.1, the inner diameter D of a hole formed in the metal block must be about 3.3 times as large as the outer diameter "d" of the contact probe.

A high-frequency, high-speed device consumes a larger amount of electric current in association with a recent increase in the degree of integration of an IC, and a very large number of earth terminals and power terminals are formed with a view toward decreasing the DC resistance and high-frequency impedance of the earth terminals and those of the power terminals. In some cases, about 600 electrode terminals/cm$^2$ are provided, and there has been developed an IC having a narrow pitch between electrode terminals, such as a pitch of about 0.4 mm. In order to impart the coaxial structure to contact probes which come into contact with electrode terminals provided at a narrow pitch of about 0.4 mm, the contact probes may fail to be compatible with an IC having a narrow pitch of about 0.4 mm unless the outer diameter of the contact probe is reduced to 0.1 mm or less.

However, the contact probes have a structure in which a spring and a plunger are inserted into a metal pipe. If the outer diameter of each of the contact probes is reduced excessively, the contact probes become very costly. Further, there is raised a problem of a drop in durability and reliability.

SUMMARY OF THE INVENTION

It is therefore an object of the invention to provide an IC socket which can be connected to wiring terminals of a wiring board connected to inspection equipment without inducing hindrance of signal transmission, even during inspection of a recent IC having electrode terminals for RF signal terminals arranged at very narrow pitches.

It is also an object of the invention to provide an IC socket in which the size of the through holes to be used for receiving probes for other than RF signal, thereby making the IC socket compact.

In order to achieve the above objects, according to the invention, there is provided an IC socket, for receiving an IC provided with arrayed terminals, comprising:

a conductive block, formed with a first face opposing to the received IC, and a plurality of holes arrayed in association with the terminals of the received IC;

a plurality of contact probes, each of which is disposed in each of the holes, and comprises:

a conductive pipe; and a conductive plunger, retractably provided at a first end of the pipe, the plunger being to be brought into contact with an associated one of the terminals; and a retainer, comprising an insulative member through which the pipe is coaxially held within an associated one of the holes while forming a gap between an outer periphery of the pipe and an interior wall of the associated one of the holes, wherein at least one of the contact probes to be brought into contact with an RF signal terminal among the terminals of the received IC is retained by the retainer.

Here, the "RF" encompasses a high analog frequency and a high-speed digital short pulse having a short pulse interval, wherein iteration of a sinusoidal wave or pulses is 1 GHz or more. Further, an "IC" encompasses a monolithic IC or a hybrid IC, such as an LSI (a large-scale integrated circuit), and a module component into which a plurality of discrete components, such as ICs and LCRs, are combined together in the form of a hybrid and which executes a required function.

With the above configuration, the specific dielectric constant $\varepsilon r$ of the dielectric substance in Equation (1) can be deemed to be substantially 1. Even when the coaxial structure is imparted with an impedance of 50 $\Omega$, the only requirement is to render the inner diameter of the hole (outer conductor) 2.3 times as large as the outer diameter of the contact probe (core conductor). Even in the case of an IC having a terminal pitch of 0.4 mm, a coaxial structure of 50 $\Omega$ can be constituted of a contact probe having an outer diameter of 0.15 mm and a hole having an inner diameter of 0.35 mm. Consequently, a contact probe of coaxial structure can be formed with a narrow space. Even an IC having RF signal terminals can be electrically connected to another equipment with very high reliability without involvement of attenuation of a signal or deformation in a signal, which would otherwise be caused by reflection.

Preferably, at least one of the contact probes is brought into contact with an earth terminal among the terminals of the received IC.

With such a configuration, not only the electric connection to the earth terminal of the IC can be performed without fail, but also an electric current can be caused to flow in response to an RF signal at low resistance without the reactance problem.

Preferably, the IC socket further comprises a conductive rubber layer, disposed between the first face of the block and an earth terminal among the terminals of the received IC.

With such a configuration, it is enabled electrical connection to the earth terminals with a wide area. An electric current can preferably be caused to flow at much lower resistance. Here, the conductive rubber layer may be a rubber sheet in which a plurality of metal wires are extending in the thicknesswise direction thereof.

Preferably, the contact probes includes a first contact probe which is brought into contact with either a non-RF signal terminal or a power supply terminal among the terminals of the received IC, and a second contact probe which is to be brought into contact with the RF signal terminal. A ratio of an inner diameter of a first hole in which the first contact probe is disposed to an outer diameter of the first contact probe is smaller than a ration of an inner diameter of a second hole in which the second contact probe is disposed to an outer diameter of the second contact probe.

With such a configuration, reactance does not raise much of a problem in a low frequency or a DC signal. If anything, small resistance is preferable, and the current capacity can be increased by rendering the contact probe thick, or the IC socket can be caused to cope with a reduction in pitch by rendering the inner diameter of the hole small. Even when an interval between the contact probe and the hole has become small, occurrence of contact between the contact probe and the hole can be prevented by coating the contact probe with an insulator.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE DRAWINGS

Preferred embodiments of the invention will be described below in detail with reference to the accompanying drawings.

Figure 1A:
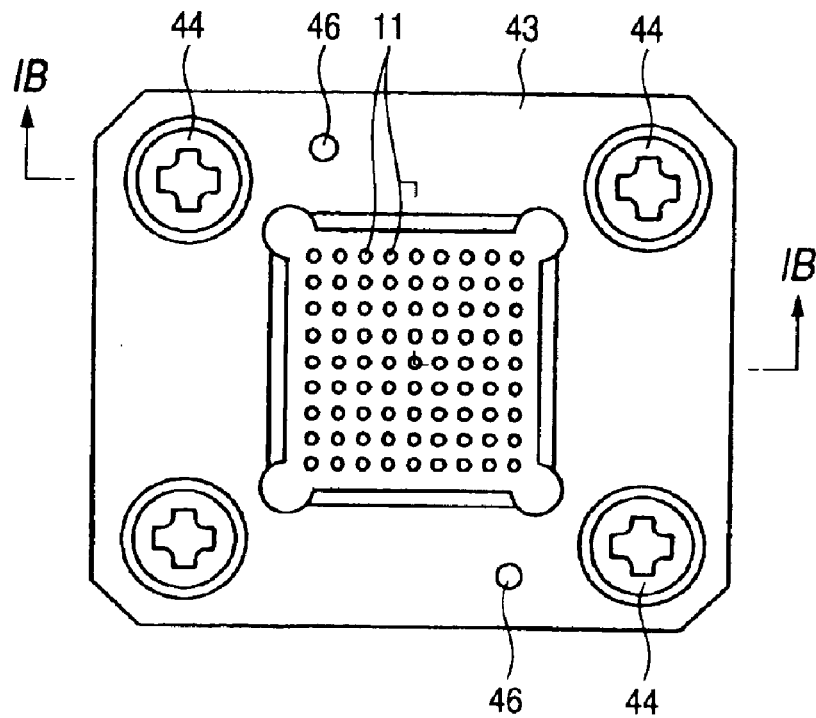
FIG. 1A is a plan view of an IC socket according to a first embodiment of the invention.

As shown in FIG. 1A, an IC socket according to a first embodiment of the invention is for connecting electrode terminals of an IC which are arranged in a matrix manner to wirings of an inspection board. Specifically, insertion holes 21 are formed in locations on a plate-shaped metal block 2, the locations corresponding to electrode terminals of the IC when the IC socket is connected to the IC. A contact probe 1 is provided in each insertion hole 21 such that plungers 11, 12 retractably project from respective ends of the insertion hole 21.

Of the contact probes 1, at least a probe to be connected to an RF signal terminal of the IC is fixed such that a hollow section 41a is formed between the probe 1 and the insertion hole 21. Further, the contact probe 1 and the insertion hole 21 are formed so as to constitute a coaxial probe 41 in which the contact probe 1 serves as a core conductor and an interior wall of the insertion hole 21 serves as an outer conductor, so as to have a predetermined impedance. Reference numeral 42 designates an earth probe which is fitted into the insertion hole 21 of a metal block 2, thereby being electrically connected thereto.

Figure 1B:
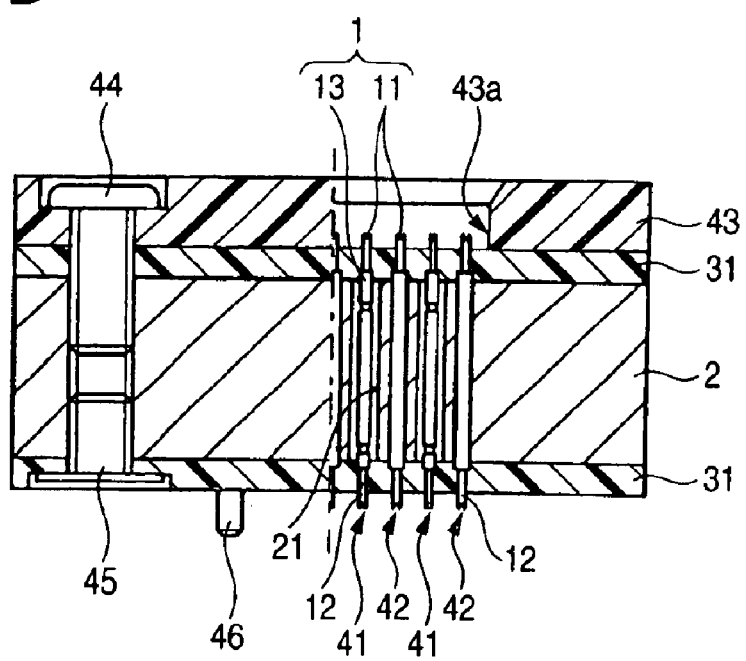
FIG. 1B is a section view taken along a line IB—IB in FIG. 1A.
Figure 1C:
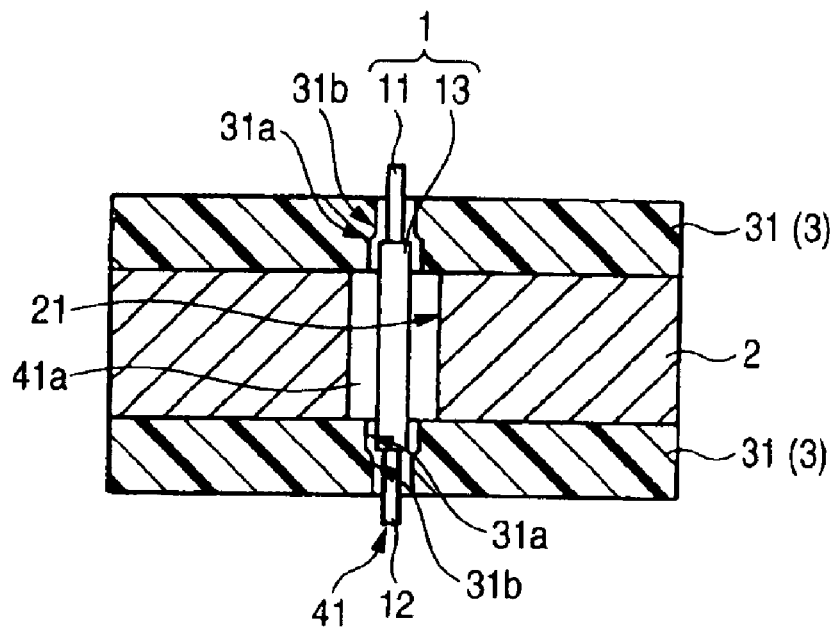
FIG. 1C is an enlarged section view showing an inspection coaxial cable for a RF signal in the IC socket of in FIG. 1B.
Figure 1D:
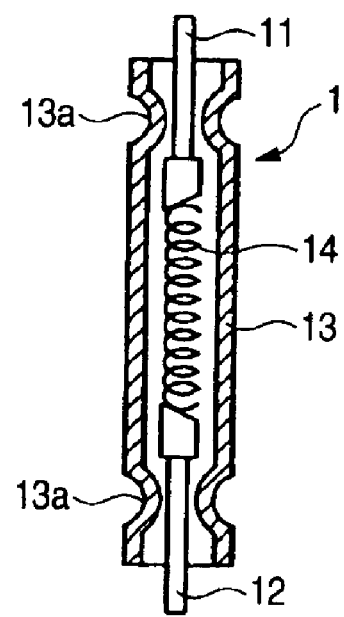
FIG. 1D is an enlarged section view of a contact probe in the inspection coaxial cable of FIG. 1C.

For instance, as shown in FIG. 1D, the contact probe 1 has a structure in which a spring 14 and one end of each of the plungers (movable pins) 11, 12 are housed within a metal pipe 13. Recessed sections 13a are formed in the metal pipe 13 so as to prevent the plungers 11, 12 from being dislodged from the metal pipe 13. The plungers 11, 12 are forced outwardly by the spring 14, so that the extremity of the plungers 11, 12 project when no force is exerted on the contact probe 1. When the extremities of the plungers 11, 12 are pressed, the spring 14 is compressed so that the plungers are retracted into the metal pipe 13. The extent to which the plunger moves is about 0.3 mm in one direction. The plunger is designed such that appropriate spring pressure (repulsion force) is achieved and reliability of the plungers is maximized when the plungers are compressed to a total length of about 0.6 mm.

The metal pipe 13 has a length of about several millimeters and is formed from, e.g., white metal (e.g., an alloy consisting of copper, nickel, and zinc). A wire of the order of about 0.1 mm formed from, e.g., an SK material (carbon tool steel material) or a beryllium copper alloy is used for the plungers 11, 12, and the spring 14 is formed from piano wire.

These contact probes 1 are retained by the metal block 2 and adapted to contact respective electrode terminals of the IC. A contact probe connected to an earth terminal of the IC may be replaced with a conductive rubber sheet (will be discussed later).

The metal block 2 is for retaining the contact probes 1 for use as signal terminals, a power terminal, or an earth terminal, which are to be brought into contact with the electrode terminals of the IC. For instance, when the contact probes 1 to be connected to the RF signal terminal are formed as coaxial probes 41 through use of a metal body, such as, aluminum, an interior wall of the insertion hole 21 into which the contact probe 1 is inserted serves as an outer conductor, while the contact probe 1 serves as a core conductor. Thus, the contact probe 1 can be formed into the coaxial structure having a small cross-sectional area.

When the contact probe 1 is formed into a signal terminal not for an RF signal or a power terminal, the contact probe 1 is fixed in the insertion hole 21 by way of an insulative tube so as not to come into contact with the metal block 2. When the contact probe 1 is formed for use as an earth terminal, the contact probe 1 is fitted within the insertion hole 21 and brought into contact with the metal block 2, thereby forming an earth probe 42. The metal block 2 usually has a thickness of about 3 to 8 mm and a size of about 30 to 50 mm per side.

As shown in FIG. 1C, in the coaxial probe 41, both ends of the metal pipe 13 are fixed so as to become concentric with the insertion hole 21 by, e.g., an insulative substrate 31, thereby forming the hollow section 41a between the contact probe 1 and the interior wall of the insertion hole 21. The relative dielectric constant $\epsilon_r$ of the hollow section 41a is reduced to 1, and the outer diameter "d" of the contact probe 1 and the inner diameter "D" of the insertion hole 21 are determined such that a predetermined impedance is achieved on the basis of Equation (1).

In order to retain the contact probe 1 concentric with the insertion hole 21 while forming the hollow section 41a in the insertion hole 21, there is provided on the surface of the metal block 2 is the insulative substrate 31 having recessed sections 31a matching in shape with the end section of the metal pipe 13 and through holes 31b formed so as to penetrate the plunger 11 therethrough substantially concentrically with the recessed sections 31a (for convenience of comprehension of the recessed section 31a, the insulative substrate 31 is exaggerated as being separated from the metal pipe 13). Each of the insulative substrates 31 has a structure in which the insulative substrate 31 is fixed to the metal block 2 by screws 44 such that the recessed section 31a becomes concentric with the insertion hole 21 of the metal block 2. This embodiment adopts a structure in which both end sections of the contact probe 1 are secured by the insulative substrates 31 and the insulative substrates 31 are provided on both sides of the metal block 2.

Consequently, both end sections of the metal pipe 13 are fitted into the recessed sections 31a of the insulative substrate 31. Further, the insulative substrates 31 are fixed in the metal block 2 such that the recessed sections 31a become concentric with the insertion hole 21 of the metal block 2. Therefore, the contact probe 1 is fixed in line with the center axis of the insertion hole 21. Moreover, the through holes 31b through which the plungers 11, 12 penetrate are formed in the insulative substrates 31. Therefore, the plungers 11, 12 project from the surfaces of the insulative substrates 31. When being pressed by a device to be inspected, the plungers 11, 12 are retracted to the surfaces of the insulative substrates 31, whereupon reliable contact can be established between electrode terminals of the device to be inspected and wiring patterns of the wiring board.

If an insulative substrate formed from resin; e.g., polyetherimide (PEI), is used as the insulative substrate 31, the recessed sections 31a and the through holes 31b can preferably be readily formed through resin molding and in accurate dimensions even when the plurality of contact probes 1 are arranged at narrow pitches. Further, if the insulative substrates 31 are formed from the foregoing resin, the substrates possess high mechanical strength. If the insulative substrates 31 are each formed to a thickness of about 1 mm, no warpage will arise and contact probes can be secured very stably even when hundreds of contact probes or more are provided in the insulative substrates 31. However, another material may also be employed, so long as the material is thin and exhibits an electrical insulative characteristic and sufficient mechanical strength.

So long as the outer diameter of the metal pipes 13 and the inner diameter of the insertion holes 21 have been set beforehand in accordance with Equation (1), coaxial probes can be readily formed with small cross-sectional areas by fitting the end sections of the metal pipes 13 into the recessed sections 31a of the insulative substrates 31 and securing the insulative substrates 31 on the metal block 2 through use of screws 44, even when a plurality of electrode terminals for an RF signal are arrayed.

Figure 4:
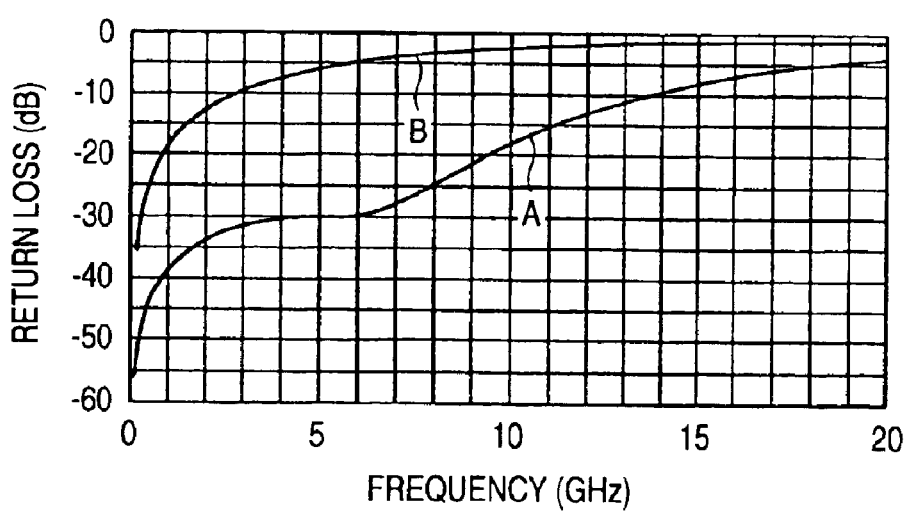
FIG. 4 is a graph showing return loss characteristics of the inspection coaxial cables shown in FIGS. 1C and 3, achieved at various frequencies.

In this embodiment, the insulative substrates 31 are formed to a thickness of about 1 mm. Since the portions of the contact probes 1 corresponding to the insulative substrates 31 are not formed in a coaxial structure, none of the contact probes is formed in a coaxial structure over the entire length thereof. However, in a case where a coaxial probe was formed such that the contact probes 1 are provided at a pitch of 0.5 mm; the outer diameter of the metal pipe 13 is set to 0.15 mm; and the inner diameter of the insertion hole 21 is set to 0.35 mm, to thus form the contact probes in a coaxial structure having a characteristic impedance of 50 Ω, return loss generated by the coaxial probe at frequencies was examined through simulation. As shown by A in FIG. 4, the return loss assumes a value of −20 dB or less at a frequency of about 10 GHz or less. Hence, there was no practical problem.

The earth contact probe 42 is to be used for establishing connection with an earth terminal of the IC. The contact probe 1, such as that shown in FIG. 1D, is tightly fitted into the insertion hole 21 of the metal block 2. The contact probe 1 having an outer diameter of, e.g., 0.3 mm, can be inserted into the insertion hole 21 having an inner diameter of 0.3 mm in a contacting manner. The inner diameter of the insertion hole 21 may be equal to the diameter of the coaxial probe 41. Thus, a thick contact probe can be used. Further, in the case of the earth contact probe, only plungers project from the metal block. All the contact probes are arranged in parallel with each other at locations where the probes come into contact with the metal block. Since the contact probes are arranged with the metal block interposed therebetween, the IC socket also has a characteristic of a very low inductance component from the viewpoint of a high frequency and a characteristic of a low resistance from the viewpoint of a direct current.

Figure 3:
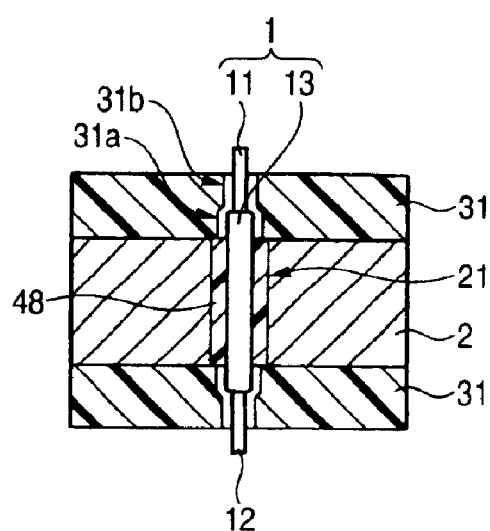
FIG. 3 is an enlarged section view showing an inspection coaxial cable for a non-RF signal in the IC socket of FIG. 1B.

The electrode terminals of the IC also include a plurality of signal terminals and power terminals for low frequency or DC signals in addition to the signal terminals for an RF signal. A probe having a structure such as that shown in FIG. 3 can be used as a probe for use with such electrode terminals. In FIG. 3, the contact probe 1, the metal block 2, and the insulative substrate 31 are identical in structure with those shown in FIG. 1C. However, the inner diameter of the insertion hole 21 is formed to a smaller size relative to the outer diameter of the contact probe 1, thereby ignoring the requirements for Equation (1). An outer periphery of the contact probe 1 is sheathed with a dielectric tube 48 formed from polyimide, thereby attempting to insulate the contact probe 1 from the interior wall of the insertion hole 21.

For instance, the IC socket was constructed by adopting a contact probe having an outer diameter of 0.3 mm for the contact probe 1 and forming the inner diameter of the insertion hole 21 to 0.42 mm. A return loss caused by the IC socket at various frequencies was examined through simulation. As shown by B in FIG. 4, a return loss has a value of −20 dB or less at a frequency of about 800 MHz. Specifically, if the signal supplied to the signal terminal is 800 MHz or less, the IC socket of this structure can be sufficiently used without involving an attenuation of a signal even when the contact probes are not formed into coaxial probes having a characteristic impedance of 50 Ω. Thus, the contact probe can be constituted so as not to be much thicker than the earth contact probe.

Even when a DC has a high current value as in the case of the power terminal, there can be constituted a power probe having large capacitance without involvement of an excessive increase in the entire cross-sectional area as a result of use of contact probes having a diameter of 0.3 mm or more. When there may be a chance of RF noise being superimposed on a power line through use of a power probe, the thus-superimposed RF noise can be bypassed by adopting ceramic having a large dielectric constant in lieu of the polyimide tube, to thereby generate capacitance between the contact probe 1 and the metal block 2. As a result, accurate inspection can be performed without being affected by noise.

Figure 2A:
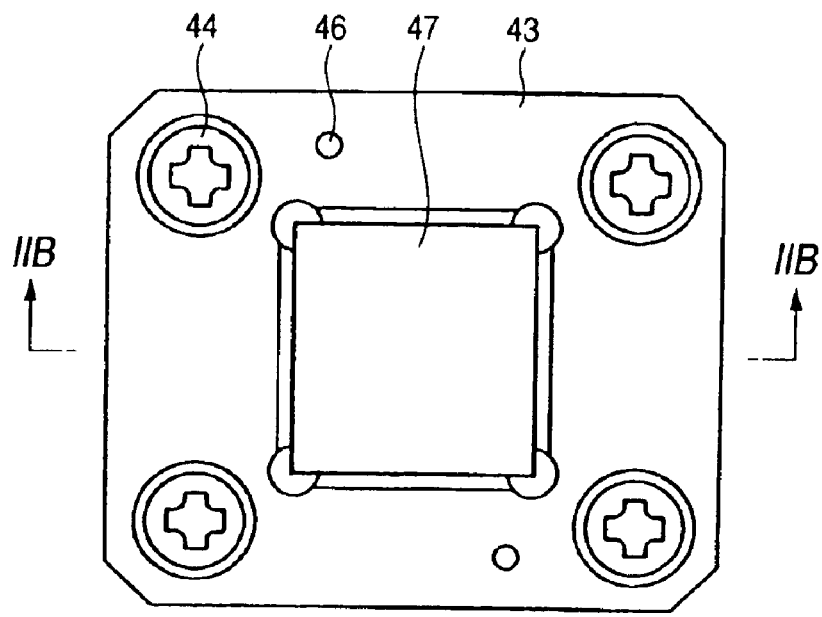
FIG. 2A is a plan view of the IC socket of FIG. 1A, showing a state that an IC is mounted thereon.

A guide plate 43 which is formed from, e.g., polyetherimide, and has an IC guide hole 43a formed therein is fastened to a side surface of the IC socket opposing an IC, and the guide plate 43 is fastened to the metal block 2 with the screws 44 in conjunction with the insulative substrate 31. In order to align the insulative substrates 31 and the guide plate 43 to the metal block 2, a positioning pin 46 is provided on the metal block 2 (see FIG. 1A). Another positioning pin 46 is formed on the other side of the metal block 2; that is, the side opposing the wiring board 5 (see FIGS. 1B and 2B). Thus, the positioning pins 46 are formed in such a manner that each can be inserted into the wiring board 5 as well and such that alignment of the wiring board 5 (see FIG. 2) can be performed simultaneously with positioning of the insulative substrates 31.

Figure 2B:
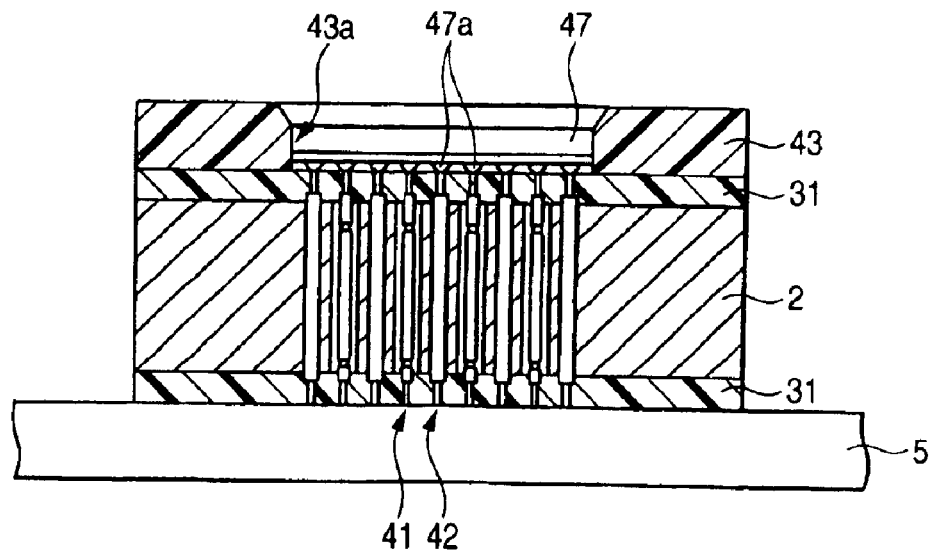
FIG. 2B is a section view taken along a line IIB—IIB in FIG. 2A.

Consequently, as shown in FIG. 2B, the plungers 12 are pressed against the wiring board 5 and retracted to the surface of the insulative substrate 31, whereupon the wiring board 5 and the insulative substrate 31 are brought into close contact with each other. Wiring terminals formed on the wiring board 5 are electrically connected to the contact probes 1.

The wiring board 5 is reliably connected to the respective RF signal electrode terminals formed in the matrix pattern with predetermined impedance of, e.g., 50 Ω. Hence, wiring boards, each being formed to predetermined impedance, are stacked, to thus constitute a multilayer substrate. An IC 47 is inserted in and pressed against the IC guide hole 43a, whereby electrode terminals 47a of the IC are connected to the wiring terminals of the wiring board 5 by way of the contact probes 1 and inspected. ICs can be sequentially inspected by replacing the thus-inspected IC with another one.

In this embodiment, in order to constitute the coaxial probe 41, the insulative substrate 31 having the recessed sections 31a whose shapes match the shapes of end sections of the metal pipes 13 is used as a retainer for concentrically fixing the contact probe 1 into the insertion hole 21 of the metal block 2. However, another retainer may be adopted to retain the contact probes 1 coaxially with the insertion holes 21. The details will be described below.

Figure 5A:
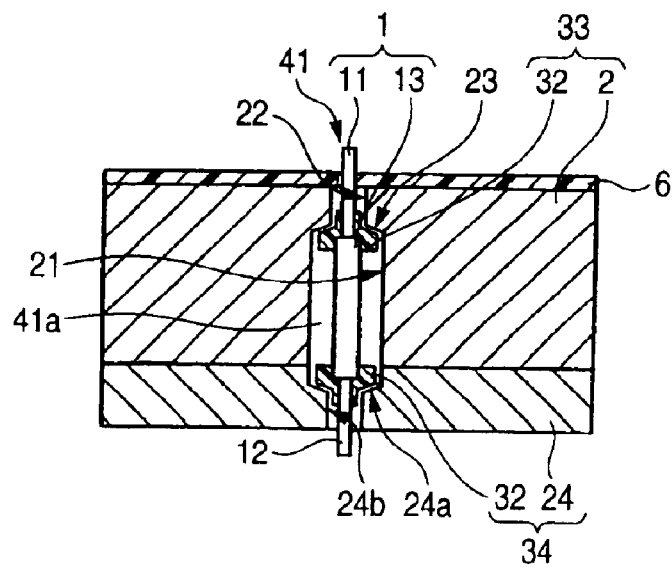
FIG. 5A is a section view of an inspection coaxial cable for the RF signal in an IC socket according to a second embodiment of the invention.

FIG. 5A shows an inspection coaxial probe according to a second embodiment of the invention. The members similar to those in the first embodiment will be designated by the same reference numerals, and the repetitive explanations will be omitted.

In this embodiment, the structure of an upper portion of the contact probe 1 (i.e., the structure of a portion of the contact probe 1 where the plunger 11 is provided) is provided with a narrowed section 23 communicated with a through hole 22 through which the plunger 11 penetrates. A retainer 33 is constituted of the metal block 2 having the narrowed section 23 formed therein, and an insulative spacer 32 interposed between the narrowed section 23 and the end of the metal pipe 13. The through hole 22 is formed in sufficient size so as not to contact the plunger 11.

Figure 5B:
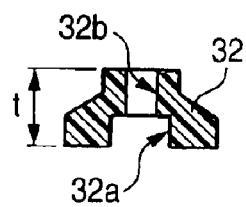
FIG. 5B is an enlarged section view of an insulative spacer in the inspection coaxial cable of FIG. 5A.

The insulative spacers 32 are formed from, e.g., polyetherimide. As shown in FIG. 5B, the outer dimension of the insulative spacer 32 is brought in conformance with the shape of the insertion hole 21 and that of the narrowed section 23. A recessed section 32a which enables insertion of the end section of the metal pipe 13 is formed in the center of one side of the insulative spacer 32. Further, a through hole 32b which enables penetration of the plunger 11 is formed in the center of the recessed section 32a, and the thickness "t" of the insulative spacer 32 is about 0.5 mm.

In FIG. 5A, reference numeral 6 designates an insulation film which is formed from, e.g., a polyimide film, and has a thickness of about 0.1 mm. The insulation film 6 is provided for preventing occurrence of, e.g., a short circuit, which would otherwise be caused when electrode terminals of the device to be inspected, such as an IC, come into contact with the metal block 2. If no such potential risk is present, the insulation film does not need to be provided, regardless of the retainer 33.

A retainer 34 is provided on a lower portion of the contact probe 1 shown in FIG. 5A (i.e., a portion of the contact probe 1 where the plunger 12 is provided). Specifically, the structure is achieved by setting the thickness of the metal block 2 to an extent to which the end section of the metal pipe 13 becomes exposed, and additionally forming a recessed section 24a and a through hole 24b in a metal cover 24 (both being identical in shape with the narrowed section 23 and the through hole 22). The metal cover 24 is fixed to the metal block 2 with unillustrated screws by way of the dielectric spacer 32 having the same shape as that of the upper retainer. The retainer 34 is constituted of the spacer 32 having the predetermined recessed section 32a and the through hole 32b formed therein, and the metal cover 24 having the predetermined recessed section 24a and the through hole 24b formed therein.

An insulative film may be provided on the metal cover 24 as in the upper portion of the metal block 2. However, in this embodiment, such an insulative film is omitted because, in many cases, the surface (i.e., the lower surface in the drawing) of the metal cover 24 is connected to a wiring board formed by stacking a plurality of films provided with wiring to be connected to inspection equipment, and earth conductors are provided on the surface of the wiring board exclusive of connected sections.

Figure 5C:
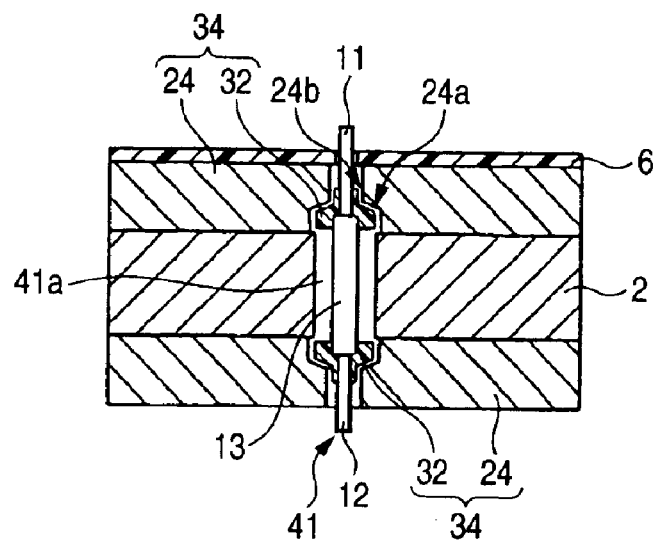
FIG. 5C is a section view of an inspection coaxial cable for the RF signal in an IC socket according to a third embodiment of the invention.

FIG. 5C shows an inspection coaxial probe according to a third embodiment of the invention. The members similar to those in the first embodiment will be designated by the same reference numerals, and the repetitive explanations will be omitted.

In this embodiment, the metal cover 24 is provided on either side of the metal block 2, so that the metal block 2 has a three-layer structure as described the above. The retainer 34 is formed in each of the metal covers 24 along with the insulative spacer 32. Moreover, the inner diameter of the recessed section 24a formed in the metal cover 24 is set so as to become greater than the inner diameter of the insertion hole 21 formed in the metal block 2. The outer diameter of the insulative spacer 32 is formed so as to become substantially identical with the inner diameter of the insertion hole 21. In other words, the diameter of the retainer 34 is slightly larger than that in the second embodiment. For instance, the diameter of the contact probe 1 assumes a value of 0.15 mm and the inner diameter of the insertion hole 21 assumes a value of 0.35 mm, and the inner diameter of the recessed section 24a is formed so as to become larger than the inner diameter of the insertion hole 21 by about 0.15 mm.

As mentioned above, as a result of the outer diameter of the insulative spacer 32 being formed slightly larger, in accordance with the increase of the amount of dielectric substance, a decrease in impedance can be avoided. Since the impedance is matched to 50 $\Omega$, the high frequency characteristic of the coaxial cable can be enhanced.

Figure 5D:
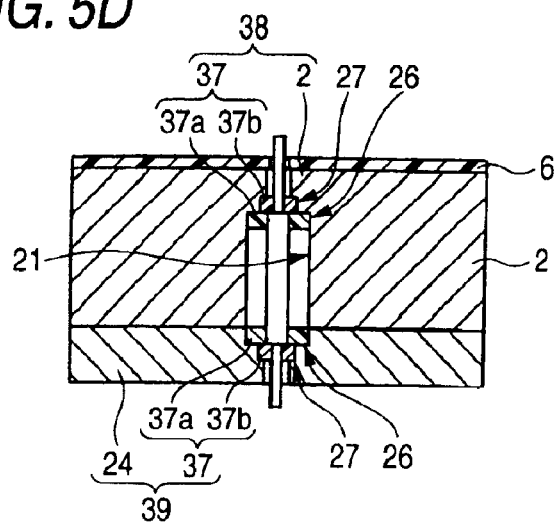
FIG. 5D is a section view of an inspection coaxial cable for the RF signal in an IC socket according to a fourth embodiment of the invention.

FIG. 5D shows an inspection coaxial probe according to a fourth embodiment of the invention. The members similar to those in the first embodiment will be designated by the same reference numerals, and the repetitive explanations will be omitted.

In this embodiment, an insulative spacer 37 to be used for retaining the contact probe 1 is constituted of a first spacer 37a provided around the metal pipe 13 of the contact probe 1, and a second spacer 37b provided around each of the plungers 11, 12. Further, a retainer 38 is constituted of the metal block 2 in which steps 26, 27 corresponding to the spacers 37a, 37b are formed, and a retainer 39 is constituted of the metal cover 24 in which similar steps 26, 27 are formed.

With such a configuration, the insulative spacer 37 can be formed in a simple ring shape. Different materials can be used for the two rings. Specifically, the only requirement for the first spacer 37a is to ensure concentricity between the contact probe 1 and the insertion hole 21, and the first spacer 37a does not require much mechanical strength. Therefore, the first spacer 37a can be formed from polytetrafluoroethylene having a small dielectric constant and a thickness of about 0.3 mm. As in the third embodiment, the influence of impedance mismatch can be inhibited without involvement of an increase in the diameter of the insulative spacer.

The second spacer 37b is for ensuring the longitudinal position of the contact probe 1. The contact probe 1 is fixed by the surface of the second spacer 37b contacting the send face of the metal pipe 13, and another surface of the same contacting the metal block 2 or the metal cover 24. Since the longitudinal force of the contact probe 1 is large, the contact probe 1 can be sufficiently retained through use of polyetherimide (PEI) having high mechanical strength and a thickness of about 0.3 mm. Since PEI has a high dielectric constant, and the inner diameter of an outer conductor must be larger than the outer diameter of the core conductor of the coaxial structure. However, the core conductors are the narrow plungers 11, 12 and have high dielectric constants. Hence, it is preferable for the dielectric constant and the outer diameter of the second spacer 37b to be larger, because a contact area between the second spacer 37b and the metal block 2 or a contact area between the second spacer 37b and the metal cover 24 can be made large, so that the second spacer 37b can retain the contact probe 1 tightly.

Figure 5E:
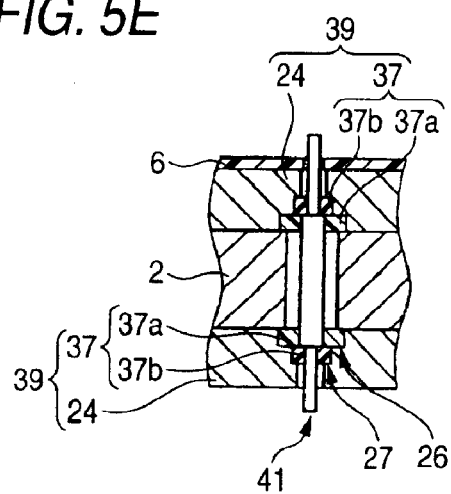
FIG. 5E is a section view of an inspection coaxial cable for the RF signal in an IC socket according to a fifth embodiment of the invention.

In this embodiment, the first spacer 37a has the same diameter as that of the insertion hole 21. However, the first spacer 37a may be given a diameter slightly larger (about 0.1 mm in diameter) than that of the insertion hole 21 and is press-fitted into the insertion hole 21. Since no longitudinal force is exerted on the first spacer 37a, the contact probe can be retained sufficiently. As a matter of course, impedance matching in accordance with Equation (1) can be achieved between the coaxial structures, by making the inner diameter of the step 26 slightly larger than the inner diameter of the insertion hole 21, as in the third embodiment, thereby enhancing the high-frequency characteristic and forming a space to be used for retaining the first spacer 37a. This configuration is shown in FIG. 5E as a fifth embodiment of the invention.

Figure 5F:
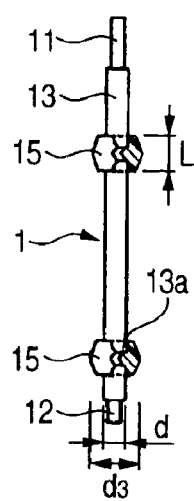
FIG. 5F is a section view of a contact probe in an IC socket according to a sixth embodiment of the invention.

FIG. 5F shows an inspection coaxial probe according to a sixth embodiment of the invention. The members similar to those in the first embodiment will be designated by the same reference numerals, and the repetitive explanations will be omitted.

In this embodiment, dielectric rings 15 are integrally formed at the recessed sections 13a of the metal pipe 13. The dielectric ring 15 is formed so as to have a diameter $d_3$ which is larger than the inner diameter D of the insertion hole 21 by about 0.1 mm to 0.2 mm, and to have a length L of about 0.4 mm. The dielectric rings 15 are fitted into the insertion hole 21 to be securely fixed.

The dielectric ring 15 is formed through resin molding. Hence, the degree of concentricity of the contact probe 1 and the degree of concentricity of the outer diameter of the dielectric ring 15 are determined accurately. Further, the coaxial structure which is constituted of the insertion hole 21 and the dielectric ring 15 is also formed accurately. Resin flows into the recessed section 13a of the metal pipe 13, whereby the contact probe 1 is fixed to the insertion hole 21 and the contact probe remains stationary when inserted into the metal block 2. Therefore, the dielectric rings 15 are convenient when fitted into the insertion hole 21. As a result, the contact probe 1 can be sufficiently retained by a thin insulation film from the surface of the metal block 2, without using a thick insulative substrate.

In this embodiment, the diameter of the dielectric ring 15 at a center portion in the axial direction of the contact probe 1 is enlarged to facilitate the insertion of the contact probe 1 into the insertion hole 21. However, the diameter may be entirely made identical. In connection with the number of the dielectric rings 15, it is enough to provide one dielectric ring at each of the end sections of the contact probe 1. However, the number may be increased in view of the length of the contact probe 1 unless the dielectric constant between the core conductor and the outer conductor is excessively increased. Incidentally, resin used to form the dielectric ring 15 is preferably resin having a small dielectric constant such as polypropylene (PP).

In the embodiments that have been described thus far, the coaxial probe 41 is formed from a structure in which the contact probe 1 is provided in the insertion hole 21 of the metal block 2 by way of a hollow section. Hence, a coaxial probe compatible with an RF signal can be used for a socket of an IC whose terminal pitch is made narrow to a pitch of about 0.4 mm. Even when RF signal terminals are adjacently arrayed, coaxial probes can be associated therewith.

However, as mentioned previously, an IC has numerous power terminals and earth terminals other than the signal terminals. Further, the signal terminals include signal terminals for low frequency purpose and signal terminals for DC, which are different from the signal terminals for RF purpose. Probes to be connected to those electrode terminals are not necessarily given a coaxial structure having a characteristic impedance.

Figure 6A:
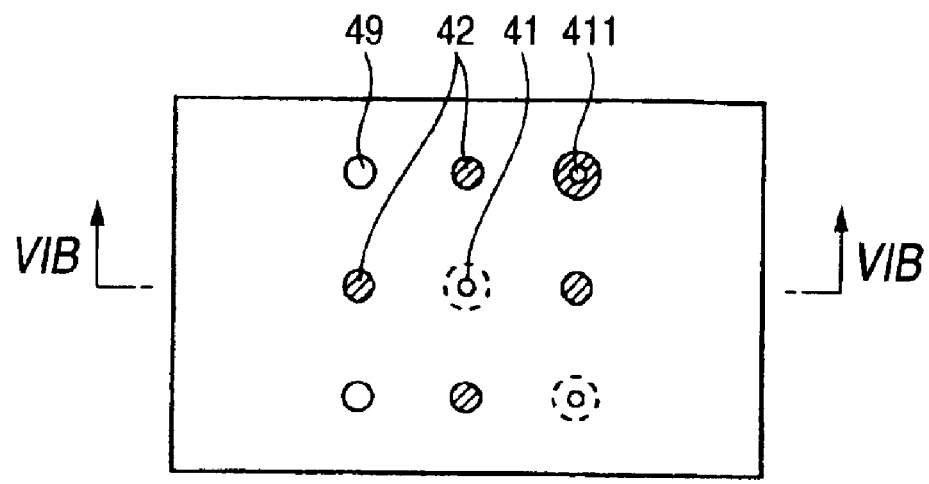
FIG. 6A is a schematic plan view of an IC socket according to a seventh embodiment of the invention.

FIG. 6A shows such an IC socket according to a seventh embodiment of the invention. The members similar to those in the first embodiment will be designated by the same reference numerals, and the repetitive explanations will be omitted.

Figure 6B:
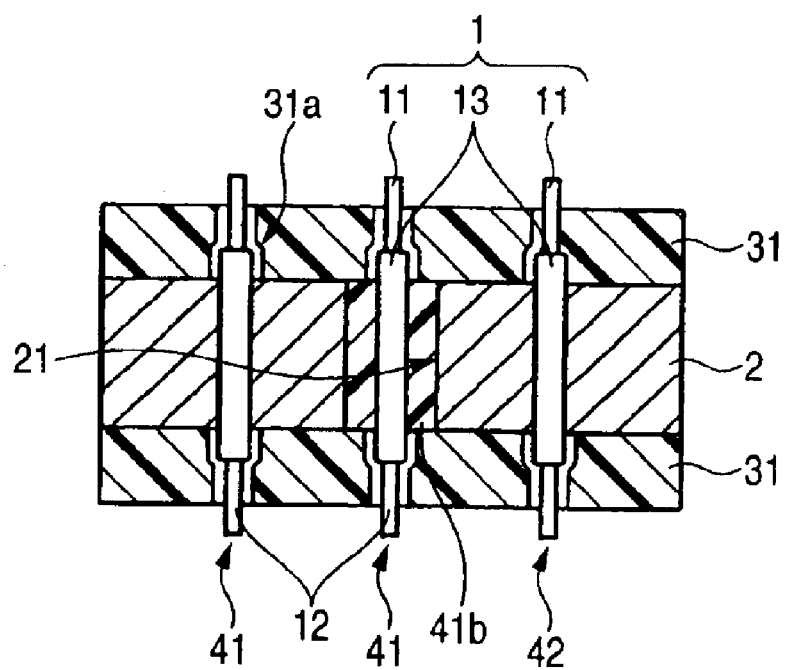
FIG. 6B is a section view taken along a line VIB—VIB in FIG. 6A.

Reference numeral 41 designates an RF signal probe; 411 designates a non-RF signal probe; 42 designates an earth contact probe; and 49 designates a power probe. As shown in FIG. 6B, the RF signal probe 41 is formed in the same structure as that of the coaxial probe shown in FIG. 1C, except that the RF signal probe 41 is formed by inserting the contact probe 1 in the insertion hole 21 of the metal block 2 by way of a dielectric tube 41b formed from, e.g., polytetrafluoroethylene. The earth probe 42 is tightly fitted into the insertion hole 21, as in the first embodiment. With such a structure, the contact probe 1 is concentrically fixed within the insertion hole 21 by the dielectric tube 41b. Hence, the dielectric substrate 31 may have a structure which has no recessed sections 31a and presses merely the end faces of the metal pipes 13.

As mentioned previously, as a result of the dielectric tube 41b being interposed between the insertion hole 21 and the contact probe 1, the inner diameter D of the insertion hole 21 requires a size which is about 3.3 times as large as the outer diameter "d" of the contact probe 1. For instance, when the contact probe 1 having an outer diameter of 0.15 mm is used, the inner diameter D of the insertion hole 21 has a value of about 0.5 mm. However, a probe adjacent to the coaxial probe 41 is the earth probe 42. Hence, even when the contact probe 1 having an outer diameter of 0.3 mm is used as an earth probe, the inner diameter of the insertion hole 21 requires a value of about 0.3 mm. Even in a case where the insertion holes 21 are arrayed at a pitch of 0.5 mm, no problem arises in mechanical strength so long as the interval between the insertion holes 21 is 0.1 mm or more.

The signal probe 411 and the power probe 49 respectively have a structure in which the contact probe 1 is inserted in the insertion hole 21 by way of the dielectric tube 48, such as that shown in FIG. 3. As mentioned previously, the structure does not need to satisfy Equation (1). Hence, a ratio of an inner diameter $D_1$ of the insertion hole 21 to an outer diameter $d_1$ of the contact probe 1 ($D_1/d_1$) can be made smaller than a ratio of an inner diameter $D_2$ of the insertion hole 21 to an outer diameter $d_2$ of the contact probe 1 corresponding to the previously-described RF signal terminal ($D_2/d_2$). The contact probe 1 can be formed in a cross-sectional area which is smaller than that of the RF signal coaxial probe, unless the outer diameter of the contact probe 1 is made extremely large. Therefore, even when the probe adjacent to the RF signal coaxial probe is not the earth contact probe, but the non-RF signal probes or the power probes, the IC socket can cope with an IC having a narrow terminal pitch.

In a case where a coaxial probe having a hollow section as shown in FIG. 1C is adopted, the probe can cope with an IC having a further narrow terminal pitch, by rendering the ratio D/d of the non-RF signal probe or that of the power probe small.

Figure 7A:
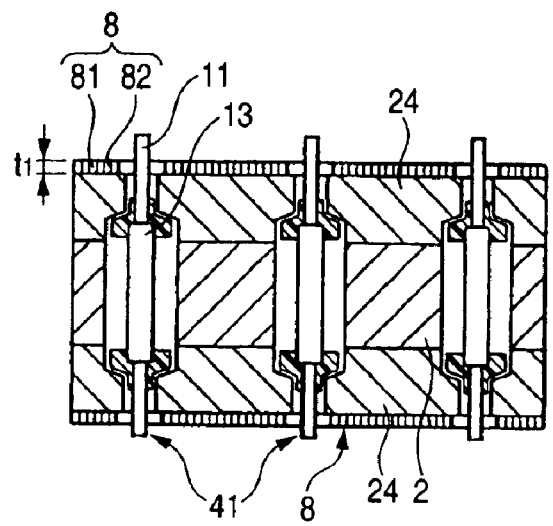
FIG. 7A is a section view of an IC socket according to an eighth embodiment of the invention.

In the above embodiments, the earth contact probe 42 is used as an earth terminal. However, another configuration may be adopted to enhance the reliability of the grounding connection. FIG. 7A shows such an IC socket according to an eighth embodiment of the invention. The members similar to those in the first embodiment will be designated by the same reference numerals, and the repetitive explanations will be omitted.

In this embodiment, the coaxial probe 41 is formed in the same structure as that shown in FIG. 5C. The earth contact probe is not formed as an earth terminal adjacent to the coaxial probe. No insertion holes are formed in the metal block 2. Instead, a conductive rubber sheet 8 is provided on the surface of the metal block 2. As a result, the earth terminal of the IC and the earth wire of the wiring board 5 are connected together by way of the conductive rubber sheet 8 and the metal block 2.

As shown in FIG. 7A, the conductive rubber sheet 8 comprises an elastic insulative material 81, such as rubber, having a thickness $t_1$ of about 0.3 mm, for example. A plurality of metal wires 82 formed from fine gold wires, or copper wires plated with gold, and having a thickness of about 20 μm to 30 μm are arranged in a matrix manner at a pitch of about 30 μm to 50 μm. As a result of the conductive rubber sheet 8 being pressed vertically, electrical connection can be established between upper and lower surfaces of the conductive rubber sheet 8 by way of the metal wires 82. Further, the metal wires 82 are horizontally insulated from each other by the insulative material 81. Hence, electrical connection is not established in a horizontal direction. The thickness of the conductive rubber sheet 8 is set appropriately, as required. For example, the thickness is preferably about 0.2 to 1 mm.

Figure 7B:
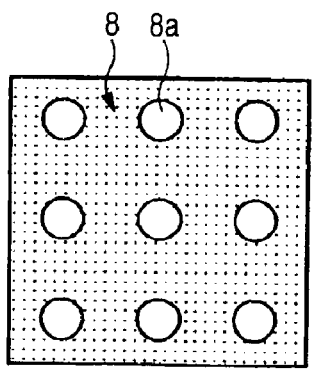
FIG. 7B is a plan view of a conductive rubber sheet in the IC socket of FIG. 7A.

As shown in FIG. 7B, through holes 8a are formed in areas of the conductive rubber sheet 8 where the signal probes and the power electrode terminal probes are to be formed, so as not to come into contact with the plungers 11 or electrode terminals of an IC. The margins of the conductive rubber sheet 8 are pressed by an unillustrated frame and fastened to the metal block 2 with screws or the like.

The earth terminal is connected not with a contact probe but with such conductive rubber, whereby the earth terminal is brought into contact and connection over a wide area. Hence, a current path can be broadened, which is preferable for signal transmission. Namely, when an electrode terminal is connected with hard metal such as a plunger, the plunger has irregularities from the microscopic viewpoint even when connection is established while the plunger is made thick. Therefore, the plunger contacts the electrode terminal with only the top portion of the plunger, and hence a contact area becomes extremely small. In contrast, the conductive rubber becomes deformed in conformance with the shape of the electrode terminal by elasticity of rubber. Hence, the conductive rubber contacts a large number of metal wires provided upright, thereby eventually increasing a contact area. Further, there is obviated a necessity for forming, in the metal block, insertion holes to be used for inserting contact probes. Hence, the conductive rubber can more easily cope with a reduction in pitch between the electrode terminals of the IC.

The eighth embodiment employs a structure in which the metal block 2 is formed into a three-layer structure and the metal cover 24 is exposed on both sides of the metal block 2. Hence, the conductive rubber sheet 8 is provided on the surfaces, by merely forming the through holes 8a from which the signal probes and the power probes have been eliminated. However, in a case where the contact probes 1 are fixed through use of insulative substrates, the conductive rubber sheet 8 cannot be electrically connected to the metal block 2.

Figure 8:
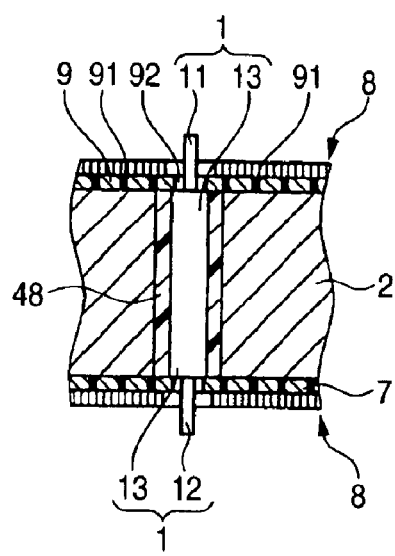
FIG. 8 is a partial section view of an IC socket according to a ninth embodiment of the invention.
Figure 9A:
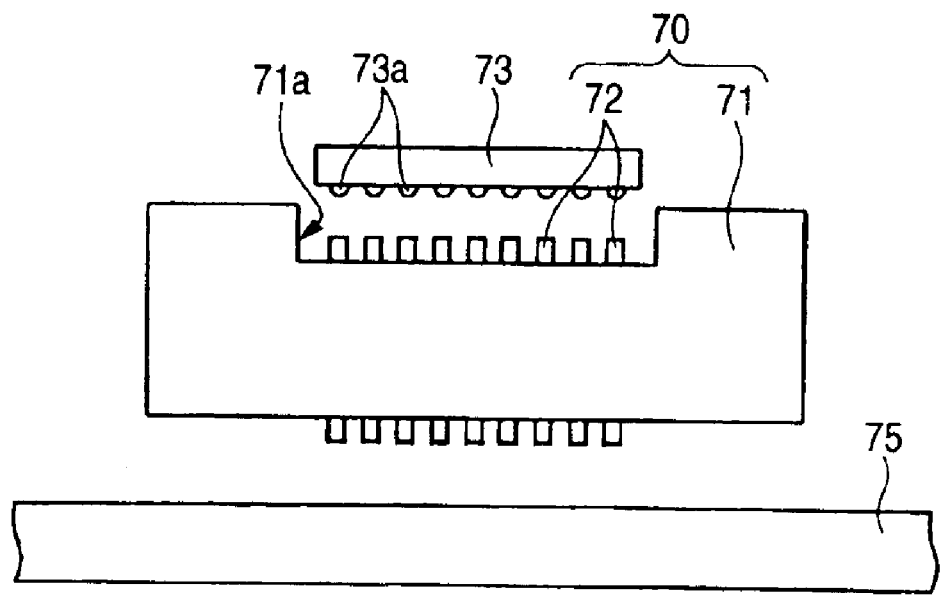
FIG. 9A is a schematic side view of a related-art IC socket.
Figure 9B:
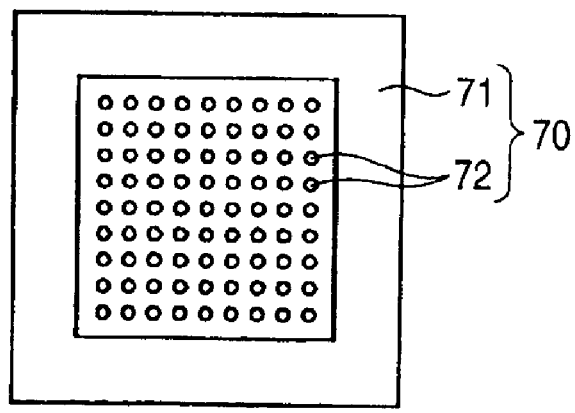
FIG. 9B is a plan view of the IC socket of FIG. 9A.

To cope with this situation, FIG. 8 shows an IC socket according to a ninth embodiment of the invention. The members similar to those in the first embodiment will be designated by the same reference numerals, and the repetitive explanations will be omitted. In this embodiment, the contact probes 1 are retained through use of a GND substrate 9 while electrical connection is established with the metal block 2. As a result, the earth terminal can be connected to the metal block 2 by the conductive rubber sheet 8.

Specifically, the GND substrate 9 is formed from, e.g., a glass epoxy substrate. Through holes 92 are formed in the GND substrate 9, wherein the through hole 92 permits penetration of the plunger 11 of the contact probe 1 and has a diameter smaller than the outer diameter of the metal pipe 13. Further, the GND substrate 9 is formed so that an upper end section of the metal pipe 13 of the contact probe 1 can be secured by the neighborhood of the through hole 92 of the GND substrate 9. Through holes, each having a diameter of about 0.3 mm, are formed in areas of the GND substrate 9 remote from the through holes 92 at an interval of about 1 mm in a matrix pattern, and vias 91 are formed in the through holes by, e.g., plating. The upper and lower surfaces of the GND substrate 9 can be electrically connected together by the vias 91.

Consequently, the GND substrate 9 can transmit the electrical potential of the metal block to the upper surface thereof while performing the function of the insulative substrate that retains the contact probes 1. The conductive rubber sheet 8 is provided on the GND substrate 9, thereby electrically connecting the earth terminal of an IC and the earth line of the wiring board 5 to the metal block 2. In FIG. 8, reference numeral 48 designates an insulative tube. The GND substrate 9 is fastened to the metal block 2 by unillustrated screws or the like.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An IC socket, for receiving an IC provided with arrayed terminals, the IC socket comprising:
   a conductive block, formed with a first face opposing to the received IC, and a plurality of holes arrayed in association with the terminals of the received IC;
   a plurality of contact probes, each of which is disposed in each of the holes, and comprises:
      a conductive pipe; and
      a conductive plunger, retractably provided at a first end of the pipe, the plunger being to be brought into contact with an associated one of the terminals; and
   a retainer, comprising an insulative member through which the pipe is coaxially held within an associated one of the holes while forming a gap between an outer periphery of the pipe and an interior wall of the associated one of the holes,
   wherein at least one of the contact probes to be brought into contact with an RF signal terminal among the terminals of the received IC is retained by the retainer.

2. The IC socket as set forth in claim 1, wherein at least one of the contact probes is brought into contact with an earth terminal among the terminals of the received IC.

3. The IC socket as set forth in claim 1, further comprising a conductive rubber layer, disposed between the first face of the block and an earth terminal among the terminals of the received IC.

4. The IC socket as set forth in claim 1, wherein:
   the contact probes includes a first contact probe which is brought into contact with either a non-RF signal terminal or a power supply terminal among the terminals of the received IC, and a second contact probe which is to be brought into contact with the RF signal terminal; and a ratio of an inner diameter of a first hole in which the first contact probe is disposed to an outer diameter of the first contact probe is smaller than a ration of an inner diameter of a second hole in which the second contact probe is disposed to an outer diameter of the second contact probe.

* * * * *